United States Patent
Jung

(10) Patent No.: US 6,677,827 B2
(45) Date of Patent: Jan. 13, 2004

(54) TEMPERATURE COMPENSATED CRYSTAL OSCILLATOR AND METHOD FOR ADJUSTING OUTPUT FREQUENCY THEREOF

(75) Inventor: Chul Young Jung, Suwon (KR)

(73) Assignee: Samsung Electro-Mechanice Co., Ltd., Kyungki-do (KR)

( * ) Notice: Subject to any disclaimer, the term of this patent is extended or adjusted under 35 U.S.C. 154(b) by 0 days.

(21) Appl. No.: 10/083,404

(22) Filed: Feb. 27, 2002

(65) Prior Publication Data

US 2003/0102929 A1 Jun. 5, 2003

(30) Foreign Application Priority Data

Dec. 4, 2001 (KR) .................................. 2001-0076125

(51) Int. Cl.7 ................................................. H03L 1/00
(52) U.S. Cl. ...................................................... 331/176
(58) Field of Search .............................. 331/176, 158, 331/116 R

(56) References Cited

U.S. PATENT DOCUMENTS 4,870,746 A * 10/1989 Klaser .......................... 29/620
5,081,439 A * 1/1992 Natzle et al. ................ 338/195
6,456,168 B1 * 9/2002 Luff ............................. 331/68

OTHER PUBLICATIONS

Abstract of Application No. JP19980200552 19980715, Publication Date Jan. 28, 2000.

* cited by examiner

Primary Examiner—My-Trang Nuton
(74) Attorney, Agent, or Firm—Lowe Hauptman Gilman & Berner LLP

(57) ABSTRACT

A temperature compensated crystal oscillator has a crystal oscillating unit and at least one part for temperature compensation and oscillation circuits. The temperature compensated crystal oscillator has a layered structure and a planar thin film resistor. The layered structure has an upper layer on which the crystal oscillator and the part are mounted, and at least one layer on which conduction patterns are formed. The planar thin film resistor is arranged on an upper surface of a bottom layer of the layered structure so as to adjust an output frequency of the temperature compensated crystal oscillator. Therefore, an area occupied by the resistor for adjusting the output frequency can be minimized by inserting the resistor between the layers.

16 Claims, 6 Drawing Sheets

TEMPERATURE COMPENSATED CRYSTAL OSCILLATOR AND METHOD FOR ADJUSTING OUTPUT FREQUENCY THEREOF

BACKGROUND OF THE INVENTION

1. Field of the Invention

The present invention relates generally to temperature compensated crystal oscillators for easily adjusting output frequencies, and more particularly to a temperature compensated crystal oscillator and method for adjusting an output frequency thereof, which can adjust the output frequency of the crystal oscillator by inserting a thin film resistor between layers comprising a layered structure and trimming the thin film resistor through a bottom layer a laser beam.

2. Description of the Prior Art

Crystal oscillators using crystal vibrating chip are essential parts to generate oscillation frequencies for controlling transmission and reception of signals between mobile communication terminals. The crystal oscillators have excellent frequency stability compared with other oscillators. A generally used crystal oscillator is a temperature compensated crystal oscillator (TCXO) for solving the problem of the variation of an oscillation frequency due to ambient temperature, FIG. 1 is an equivalent circuit diagram of a conventional temperature compensated crystal oscillator. As shown in FIG. 1, the temperature compensated crystal oscillator comprises a frequency adjusting circuit 10, a temperature compensation circuit 20, a crystal oscillator 30 and an oscillation circuit 40 realized as an IC chip. The temperature compensation circuit 20 controls the crystal oscillator 30 to resonate at a predetermined frequency to correspond to capacitance and inductance varied according to ambient temperature using a thermistor. Then, the crystal oscillator 30 oscillates at the compensated resonance frequency through the oscillation circuit 40.

The temperature compensation crystal oscillator additionally has the frequency adjusting circuit 10 so as to provide a correct output frequency at room temperature. In the temperature compensated crystal oscillator, it is impossible to adjust inductance as in a voltage controlled oscillator (VCO). Therefore, the temperature compensated crystal oscillator generally uses a method for adjusting a trimmer capacitor or a trimmable chip resistor. Especially, the trimmable chip resistor 9, which is favorable in terms of an arrangement area and easiness of trimming operation, is generally used as shown in FIG. 1.

FIGS. 2a and 2b are respectively a side sectional view and a schematic perspective view of a conventional temperature compensated crystal oscillator 50. The temperature compensated crystal oscillator 50 is an embodiment of the temperature compensated crystal oscillator of FIG. 1, and shows the structure for adjusting a frequency using a trimmable chip resistor. As show in FIG. 2a, the temperature compensated crystal oscillator 50 has a structure in which a crystal oscillating unit 53, parts 55 for temperature compensation and oscillation circuits, and a trimmable chip resistor 59 are mounted on the top layer 51 of layered structure comprised of two layers. Further, a metal case 57 is covered on the upper surface of top layer 51, such that a mounting area on the upper surface of top layer 51 is shielded from external electrical and mechanical influences. Because the case 57 is made of a metal, a hole 57a is formed at the metal case 57 so as to trim the chip resistor 59 with a laser beam, as shown in FIG. 2b, and then the chip resistor 59 is trimmed through the hole 57a.

However, the trimmable chip resistor employed in the conventional temperature crystal oscillator of FIG. 2 has a size of several mm². As a result, it requires a considerable mounting area compared with the crystal oscillator having a size of only approximately 5.0×3.2 mm² or 4.7×2.9 mm². Consequently, the size of trimmable chip resistor increases the size of a final product, and makes the miniaturization suitable for mobile communication terminals difficult.

Accordingly, in this technical field, it is strongly required to develop a temperature compensated crystal oscillator having a new structure and a method of adjusting the output frequency using the new structure, wherein a trimmable chip resistor can be mounted without greatly increasing the product size and can be trimmed in the state of final product, that is, at the last step of the process.

SUMMARY OF THE INVENTION

Accordingly, the present invention has been made keeping in mind the above problems occurring in the prior art, and an object of the present invention is to provide a temperature compensated crystal oscillator, in which a planar thin film resistor is formed on the upper surface of a bottom layer of a layered structure, thus minimizing an installation area occupied by the thin film resistor for adjusting an output frequency.

Another object of the present invention is to provide an output frequency adjusting method, by which an output frequency can be adjusted in the state of a final product by trimming a planar thin film resistor with a laser beam through the lower surface of a bottom layer having an upper surface on which the planar thin film resistor is arranged.

In accordance with one aspect of the present invention, the above and other objects can be accomplished by the provision of a temperature compensated crystal oscillator including a crystal oscillating unit and at least one part for temperature compensation and oscillation circuits, comprising a plurality of layers having an upper layer on which the crystal oscillating unit and the part are mounted, and at least one layer on which conduction patterns are formed; and a planar thin film resistor arranged on an upper surface of a bottom layer of the layered structure for adjusting an output frequency of the temperature compensated crystal oscillator.

The present invention can be provided in two types, according to a mounting structure formed on the upper layer.

In a preferred embodiment of this invention, a layered structure is comprised of a first layer on which conduction patterns for mounting the crystal oscillator and the part are formed, a second layer arranged under the first layer and provided with an upper surface on which other conduction patterns connected to the conduction patterns of the first layer are formed, and a third layer arranged under the second layer, wherein the first layer is the upper layer on which the crystal oscillating unit and the part are mounted, and the third layer is the bottom layer on which the planar thin film resistor is formed.

Further, in another embodiment of this invention, a layered structure is comprised of a first layer having an upper surface on which the crystal oscillating unit is arranged and having a cavity formed therein, a second layer on which conduction patterns for mounting the part for temperature compensation and oscillation circuits are formed at a region exposed to the cavity of the first layer, and a third layer arranged under the second layer, wherein the first and second layers compose an upper layer on which the crystal oscillating unit and the part are respectively formed on upper surfaces of the first and second layers, and the third layer is the bottom layer on which the planar thin film resistor is formed on its upper surface.

Moreover, in the preferred embodiment of this invention, at least one fourth layer is additionally arranged between the second and third layers so as to sufficiently realize signal lines of the temperature compensated crystal oscillator, wherein other conduction patterns connected to conduction patterns of other layers can be formed on the upper surface of the fourth layer. In this case, the second to fourth layers can be preferably manufactured as a single printed circuit layer so as to form signal lines, such as the temperature compensation circuit, the oscillation circuit and the frequency adjusting circuit, in one process.

More preferably, the conduction patterns formed on the upper surface of the fourth layer are formed at a remaining region except a region vertically overlapped with a region, at which the planar thin film resistor is formed, so as to reduce the risk of damage caused by a laser beam trimming process. Most preferably, a laser beam blocking film covering a region on the upper surface of the fourth layer, vertically overlapped with a region at which the planar thin film resistor is formed, can be additionally formed. At this time, the laser beam blocking film is preferably made of a thin metal film.

In accordance with another aspect of the present invention, there is provided a method for adjusting an output frequency of a temperature compensated crystal oscillator comprised of a layered structure, comprising the steps of providing a temperature compensated crystal oscillator in which a planar thin film resistor is arranged on an upper surface of a bottom layer of a layered structure; and trimming the planar thin film resistor arranged on the upper surface of the bottom layer by irradiating a laser beam on the lower surface of the bottom layer so as to obtain a predetermined output frequency.

Furthermore, in the temperature compensated crystal oscillator, a laser beam blocking layer made of a thin metal film is preferably arranged at a region on the upper surface of another layer to be arranged over the bottom layer so as to include, a region vertically overlapped with the region at which the planar thin film resistor is formed. Further, a mark is formed at a region on the lower surface of the bottom layer, corresponding to the position of the planar thin film resistor formed on the upper surface of the bottom layer, and a laser beam is irradiated along the mark, thus allowing the trimming process to be easily performed.

BRIEF DESCRIPTION OF THE DRAWINGS

The above and other objects, features and other advantages of the present invention will be more clearly understood from the following detailed description taken in conjunction with the accompanying drawings, in which:

FIG. 4b is a perspective view showing the layered layers employed in the temperature compensated crystal oscillator of FIG. 4a;

DESCRIPTION OF THE PREFERRED EMBODIMENTS

Figure 1:
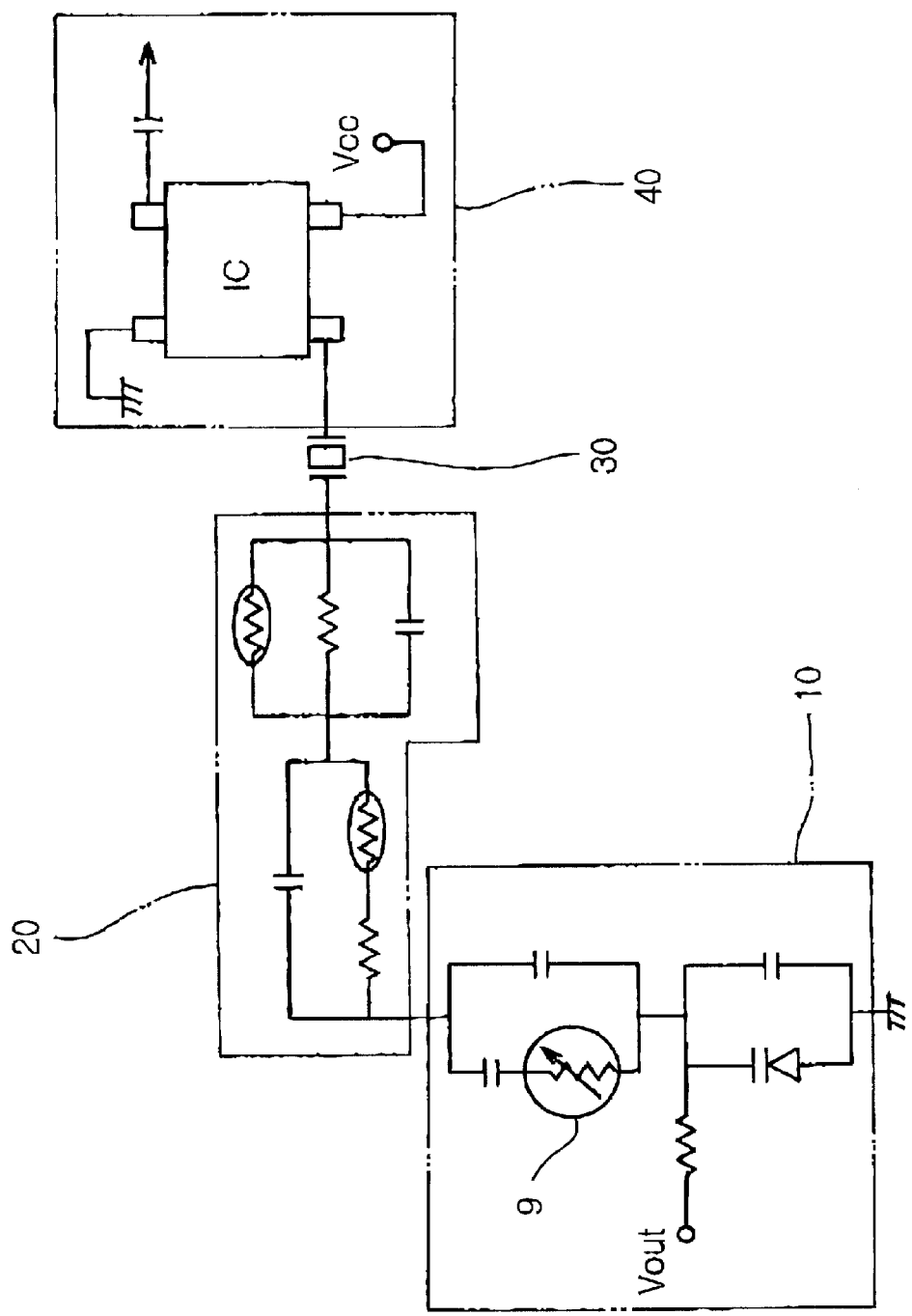
FIG. 1 is a an equivalent circuit diagram of a conventional temperature compensated crystal oscillator.
Figure 2A:
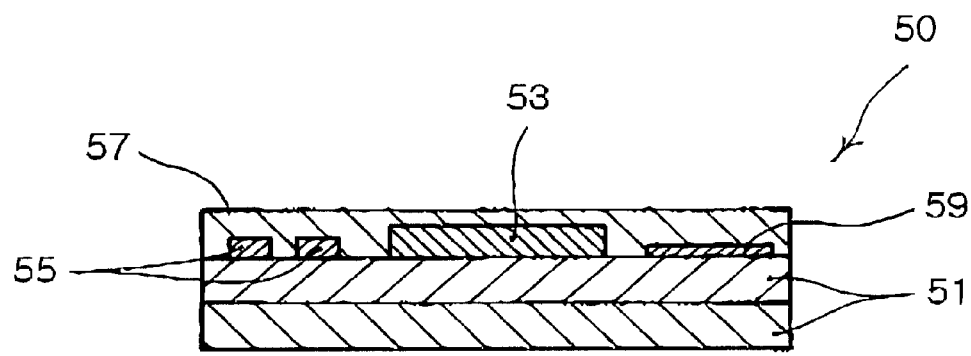
FIGS. 2a and 2b are respectively a side sectional view and a schematic perspective view of a conventional temperature compensated crystal oscillator.
Figure 2B:
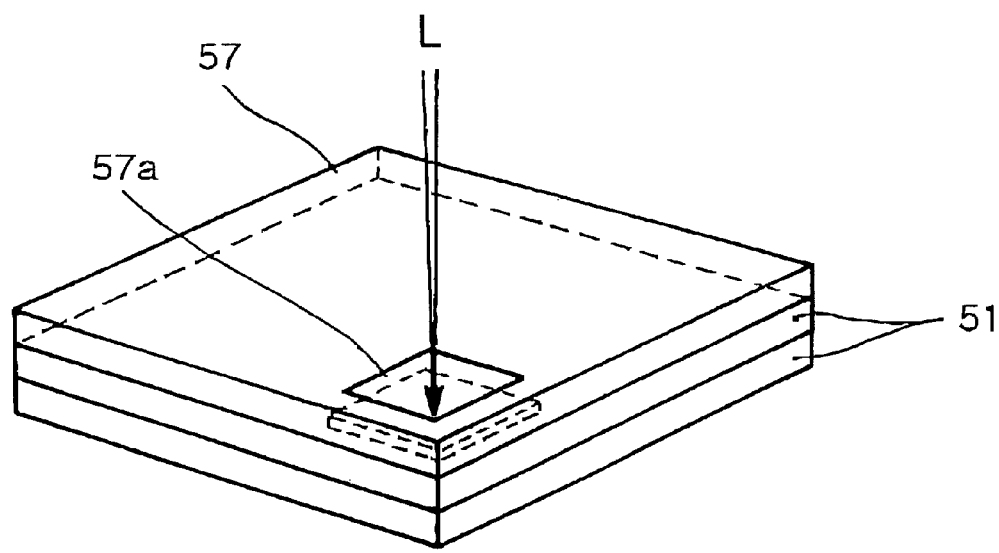
Figure 3:
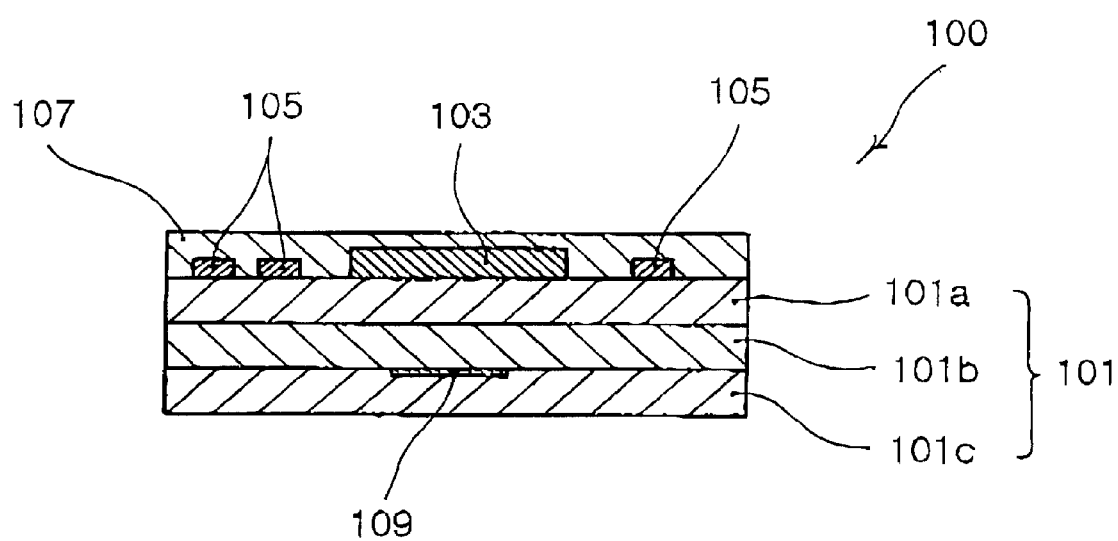
FIG. 3 is a side sectional view of a temperature compensated crystal oscillator according to a preferred embodiment of the present invention.

FIG. 3 is a side sectional view of a temperature compensated crystal oscillator 100 according to a preferred embodiment of this invention.

Referring to FIG. 3, the temperature compensated crystal oscillator 100 comprises a top layer 101 with conduction patterns printed on the upper surface where a crystal oscillating unit 103 and parts 105 composing a temperature compensation circuit and an oscillation circuit are mounted. Here, the oscillating unit 103 contains a crystal vibrating chip inside to produce an output frequency. The layered structure 101 is comprised of three layers 101a, 101b and 101c. Further, the upper surface of the first layer 101a, on which the crystal oscillating unit 103 and the circuit parts 105 are mounted, is covered with a metal case 107.

As shown in FIG. 3, the present invention is characterized in that a planar thin film resistor 109 is formed on the upper surface of the third layer 101c, which is a bottom layer. In the prior art, a resistor for adjusting an output frequency is mounted together on the upper surface on which the parts are mounted, a hole is formed at a metal case, and then the resistor is trimmed. On the other hand, in the preferred embodiment of this invention, the resistor 109 made of a planar thin film is used as the resistor for adjusting the output frequency and is formed on the upper surface of the third layer 101c which is the bottom layer of the layered structures thus reducing the size of a product by a volume corresponding to the resistor 109 for adjusting the output frequency.

In a different embodiment of this invention, a cavity is formed in the layer on which the crystal oscillating unit is mounted so as to further miniaturize the product size, such that the present invention can be applied to embodiments in which a part mounting area is formed in the layered structure. This embodiment is shown in FIG. 4a.

Figure 4A:
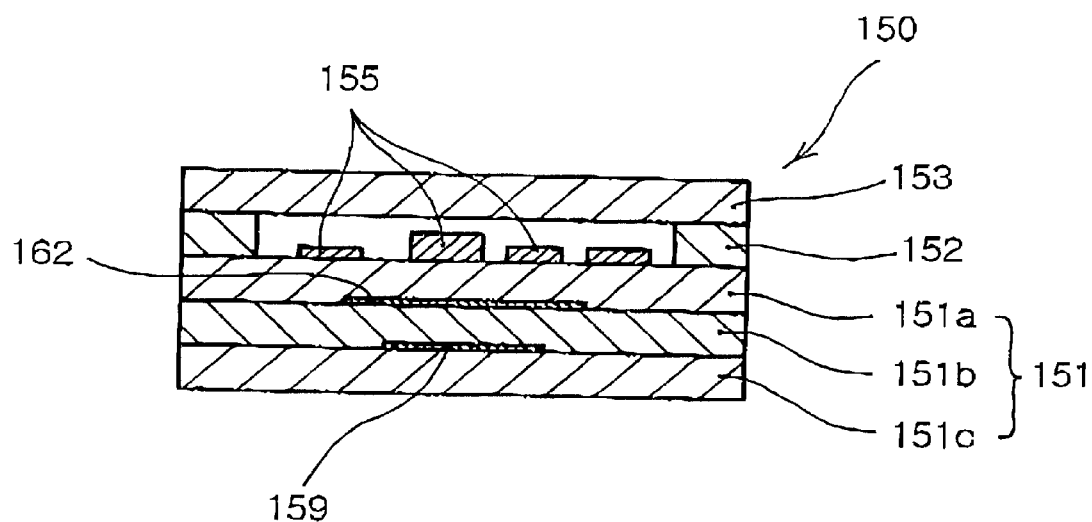
FIG. 4a is a side sectional view of another temperature compensated crystal oscillator according to another preferred embodiment of this invention.
Figure 4B:
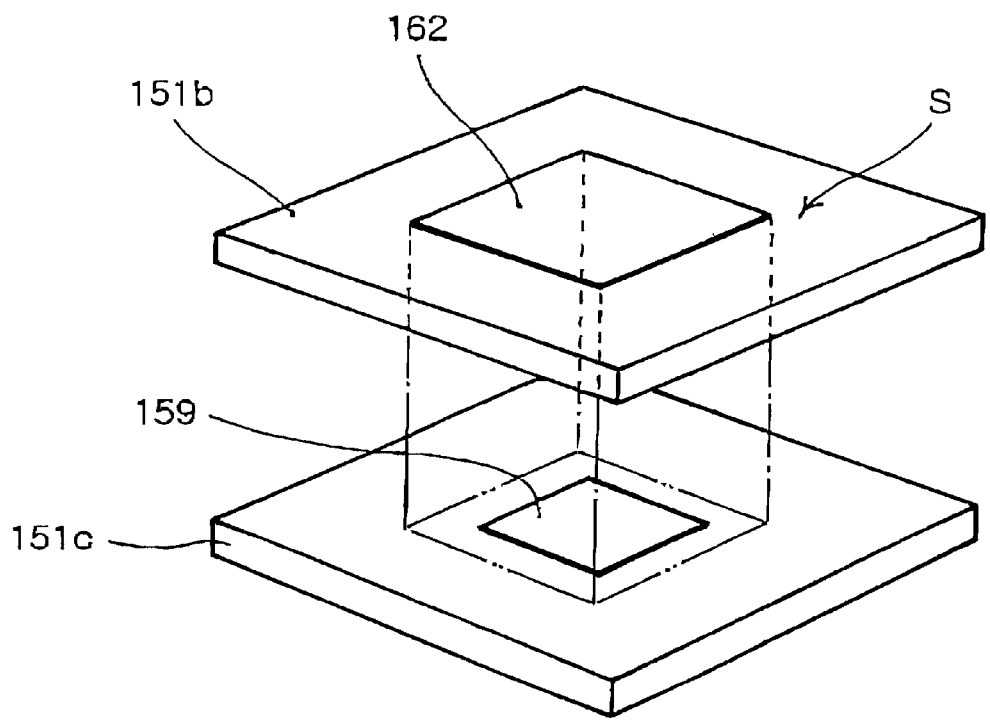

FIGS. 4a and 4b are respectively a side sectional view and a perspective view of another temperature compensated crystal oscillator 150 according to another preferred embodiment of this invention.

Referring to FIG. 4a, the temperature compensated crystal oscillator 150 comprises a crystal oscillating unit 153, a first layer 152 for supporting the crystal oscillator 153 and having a cavity formed therein, and three layers placed under the first layer 152. Here, one or more parts 155 for temperature compensation and oscillation circuits are mounted on the upper surface of a second layer 151a, which is formed as the cavity of the first layer 152.

The three layers each have an upper surface on which signal lines are formed as conduction patterns. A layer placed under the first layer 152 can be comprised of only the second layer 151a for mounting the circuit parts 155 and the third layer 151c for forming the planar thin film resistor 159. However, in this embodiment, the total area of a layer for realizing circuit patterns is reduced in comparison with the crystal oscillator of FIG. 3. Therefore a fourth layer 151b is additionally inserted between the second layer 151a and the third layer 151c, thus increasing the area of a layer on which conduction patterns can be formed on its upper surface, thus increasing the layer area. The fourth layer 151b can be realized as a plurality of layers if necessary.

In this embodiment of the present invention, the planar thin film resistor 159 is formed on the upper surface of the third layer 151c. The planar thin film resistor 159, which is a conductor, can be trimmed using the laser beam irradiated on the lower surface of the third layer 151c. As well known in the field, the laser beam can pass through a typical material, of which the layered structure is made, to trim the planar thin film resistor. Accordingly, there is no need to form an additional hole at the third layer 151c, and an output frequency adjusting operation can be performed on the final product.

Further, in the preferred embodiment, a laser beam blocking film 162 is additionally formed on the upper surface of the fourth layer 151b, contrary to the embodiment of FIG. 3.

FIG. 4b is a perspective view showing the fourth layer 151b on which the laser beam blocking film 162 is formed and the third layer 151c on which the planar thin film resistor 159 is formed. As shown in FIG. 4b, the laser beam blocking film 162 has a size larger than at least the planar thin film resistor 159 formed on the upper surface of the third layer 151c, and is formed on the upper surface of the fourth layer 151b so as to vertically overlap a region of the planar thin film resistor 159.

The laser beam blocking film 162 is defined as a blocking layer for preventing the laser beam irradiated during a trimming process from passing through the fourth layer 151b to affect the conduction patterns on the upper surface of the second layer 151a. Because such a laser beam blocking layer 162 is formed between layers, it is preferably made of a thin metal film. If the fourth layer 151b is comprised of two or more layers, the laser beam blocking film 162 is preferably formed on the fourth layer placed right on the upper surface of the third layer on which the planar thin film resistor is formed.

Further, the conduction patterns on the fourth layer 151b are preferably formed at a remaining region except a region vertically overlapped with the planar thin film resistor 159 of the second layer 151a. In other words, even though the laser beam is irradiated on the exact position of the thin film resistor 159 in trimming the planar thin film resistor 159, if an appropriate trimming time is exceeded, the laser beam may pass through the fourth layer 151b to affect the conduction patterns on its upper surface. In this case, if the conduction patterns are formed at a region on the upper surface of the fourth layer 151b, vertically overlapped with the planar thin film resistor 159, the conduction patterns can be easily damaged by the laser beam.

Therefore, as shown in FIG. 4b, it is preferable to limit the region, at which the conduction patterns are formed on the fourth layer 151b, to a remaining region on the upper surface except the region overlapped with the planar thin film resistor 159. Such a method can be coupled to the formation of the laser beam blocking film 162 shown in FIG. 4 by forming the laser beam blocking film 162 on the upper surface of the fourth layer 151b so as to have an area somewhat larger than the planar thin film resistor 159, and forming the conduction patterns on the remaining region S on upper surface of the fourth layer 151b. Consequently, a stable trimming process for more effectively protecting the conduction patterns can be achieved through the above method.

Figure 5:
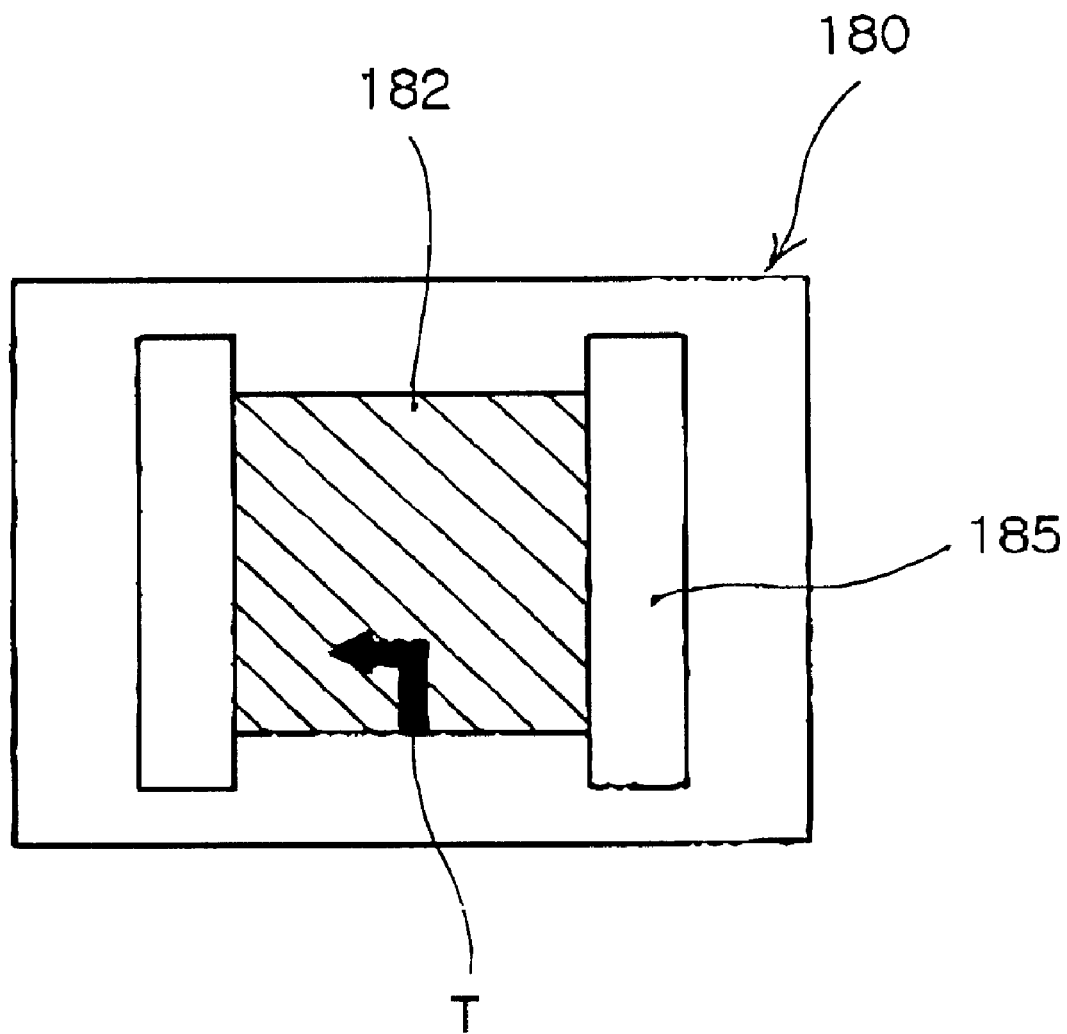
FIG. 5 is a plane view showing an example of a bottom layer on which a planar thin film resistor used in the present invention is formed.

FIG. 5 is a plane view showing an example of the bottom layer 180 on which a planar thin film resistor used in the present invention is formed. Referring to FIG. 5, the upper surface of the bottom layer 180 (third layers 101c and 151c of FIGS. 3 and 4) on which a planar thin film resistor 182 is formed is shown.

The planar thin film resistor 182 used in the embodiment of the present invention is an Ohmega-ply manufactured by Ohmega Technologies Inc. Ohmega-plys have regular square shapes and have resistances such as 25 Ω and 50 Ω according to their qualities. That is, a planar thin film resistor having a required resistance can be realized with an appropriate thickness and size by selecting one of the Ohmega-plys having different resistances. For example, when the regular square-shaped planar thin film resistor 182 shown in FIG. 5 has a resistance of 50 Ω, if the width or length of the resistor 182 is increased by two times, its resistance value becomes 100 Ω. Conduction patterns 185 are formed at both sides of the planar thin film resistor 182 of FIG. 5 and connected to the planar thin film resistor 182. The conduction patterns 185 are patterns for connecting the resistor 182 to circuits realized by conduction patterns on other layers. If the conduction patterns 185 are formed at both sides of the resistor 182, the resistance of the planar thin film resistor 182 can be varied by trimming the resistor 182 from a region of a side, to which the conduction patterns are not connected, to a center region of the resistor 182 (represented with "T" of FIG. 5b), as well known in the field. In a temperature compensated crystal oscillator oscillating at a frequency of 10 MHz, the frequency of approximately 200 Hz can be minutely adjusted through this trimming process.

The present invention further provides a new method for adjusting an output frequency of the temperature compensated crystal oscillator. That is, a temperature compensated crystal oscillator, in which a planar thin film resistor is arranged on the upper surface of a bottom layer of layered structure, is provided, and then laser beam is irradiated on the lower surface of the bottom layer, such that the thin film resistor arranged on the upper surface is trimmed, thus obtaining a desired output frequency.

Figure 6:
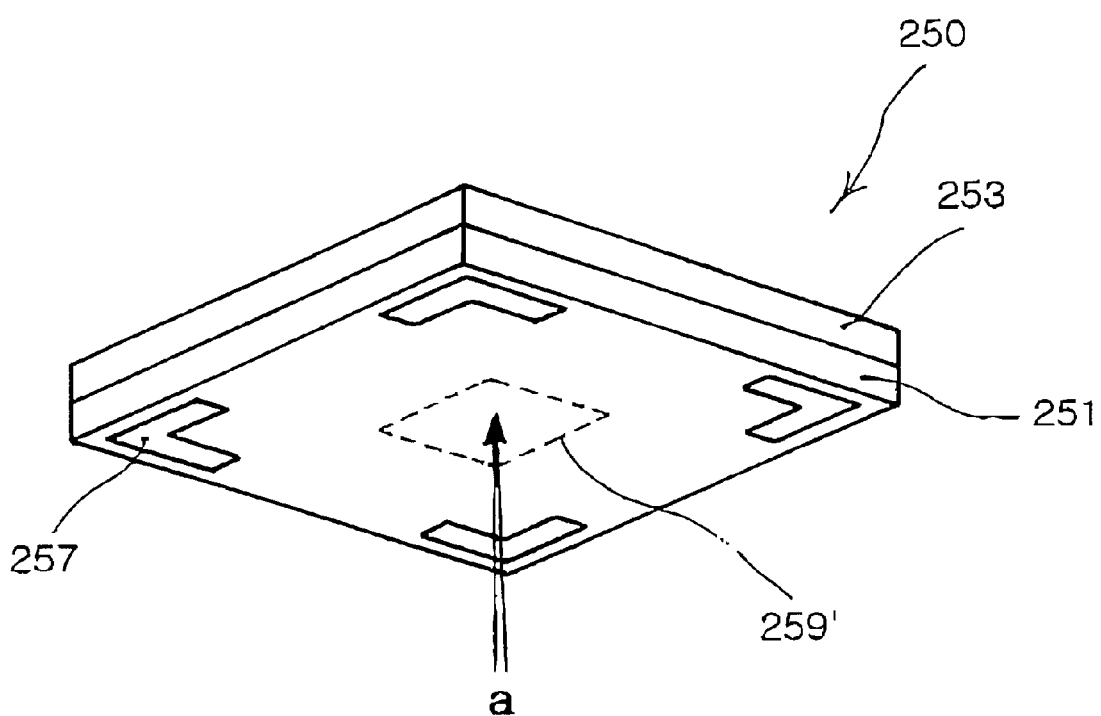
FIG. 6 is a schematic view showing an example of a frequency adjusting method of this invention.

FIG. 6 is a view showing an example of a frequency adjusting method of this invention. Referring to FIG. 6, a temperature compensated crystal oscillator 250 is manufactured, as shown in the embodiment of FIG. 4. A planar thin film resistor (not shown) is arranged on the upper surface of the bottom layer 251 of the temperature compensated crystal oscillator 250. In the preferred embodiment, a mark 259' is formed at a region on the lower surface of bottom layer 251, corresponding to the position of the planar thin film resistor inserted between an upper layer 253 and a bottom layer 251, such that an exact position of the planar thin film resistor can be found later in a laser beam trimming process. Then, the trimming process is executed by irradiating a laser beam on the lower surface of the bottom layer on the basis of the mark as shown in FIG. 6.

When the temperature compensated crystal oscillator is provided, a laser beam blocking film is arranged at a region on the upper surface of another layer to be arranged over the bottom layer, corresponding to the region at which the planar thin film resistor is formed, thus preventing the laser beam passing through the layer from damaging conduction patterns formed on the upper surface of another layer.

As described above, the present invention provides a temperature compensated crystal oscillator, in which a planar thin film resistor for adjusting an output frequency is formed on the upper surface of a bottom layer of a layered structure, such that an area occupied by a resistor for adjusting an output frequency can be minimized, thus realizing the miniaturization of products.

Further, the present invention provides an output frequency adjusting method, which provides a temperature compensated crystal oscillator in which a planar thin film resistor is formed on the upper surface of a bottom layer of a layered structure, and trims the planar thin film resistor by irradiating a laser beam on the lower surface of the bottom layer. The method is advantageous in that it adjusts an output frequency in the state of a final product, thus obtaining a more precise output frequency at room temperature.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A temperature compensated crystal oscillator, comprising a crystal oscillating unit and temperature compensation and oscillation circuits, said temperature compensated crystal oscillator further comprising:

a layered structure; and a planar thin film resistor for adjusting an output frequency of the temperature compensated crystal oscillator;

wherein the layered structure comprises:
  a first layer having an upper surface on which the crystal oscillating unit is arranged and having a cavity formed therein;
  a second layer which is disposed below the first layer and on which conductive patterns of said temperature compensation and oscillation circuits are formed in an area of an upper surface of the second layer so as to be inside the cavity of the first layer;
  a third layer arranged under the second layer, the planar thin film resistor being arranged on an upper surface of the third layer; and
  at least one fourth layer, the fourth layer being additionally arranged between the second and third layers and having an upper surface on which other conductive patterns connected to the conductive patterns of other layers are formed.

2. The temperature compensated crystal oscillator according to claim 1, wherein the second to fourth layers are realized as a single printed circuit layer.

3. The temperature compensated crystal oscillator according to claim 1, wherein the conductive patterns of the fourth layer are formed in a region that does not vertically overlap the planar thin film resistor.

4. The temperature compensated crystal oscillator according to claim 1, wherein the fourth layer further includes a laser beam blocking film formed to cover at least a region of the upper surface of the fourth layer, said region corresponding to and vertically overlapping the planar thin film resistor.

5. The temperature compensated crystal oscillator according to claim 4, wherein the laser beam blocking film is a thin metal film.

6. A method of adjusting an output frequency of a temperature compensated crystal oscillator, said method comprising the steps of:
  providing said temperature compensated crystal oscillator which comprises
    a layered structure having an upper layer, a lower layer and at least one middle layer between the upper and lower layers,
    a crystal oscillating unit and at least one part for temperature compensation displaced on the upper layer,
    a laser beam blocking film arranged on said at least one middle layer, and
    a planar thin film resistor arranged on an upper surface of the lower layer; and
  trimming the planar thin film resistor arranged on the upper surface of the lower layer by irradiating a laser beam on a lower surface of the lower layer so as to obtain a predetermined output frequency.

7. The method according to claim 6, wherein the laser beam blocking film is formed in a region of the upper surface of said at least one middle layer, said region corresponding to and overlapping the planar thin film resistor.

8. The method according to claim 6, wherein the providing step further includes the step of forming a mark on the lower surface of the lower layer, corresponding to the position of the planar thin film resistor formed on the upper surface of the lower layer.

9. The method according to claim 8, wherein the trimming step is performed by irradiating the laser beam on the lower surface of the lower layer where the mark is formed.

10. A temperature compensated crystal oscillator, comprising:
  a layered structure having an upper layer, a lower layer and at least one middle layer between the upper and lower layers;
  a crystal oscillating unit disposed on the upper layer;
  a laser beam blocking film arranged in a first area of the at least one middle layer;
  first conductive patterns displaced in a second area of the at least one middle layer to form oscillation circuits; and
  a planar thin film resistor arranged on an upper surface of the lower layer of the layered structure for adjusting an output frequency of the temperature compensated crystal oscillator.

11. The temperature compensated crystal oscillator according to claim 10, further comprising second conductive patterns on the upper layer, wherein said at least one middle layer comprises:
  a first layer arranged under the upper layer and having an upper surface on which the first conductive patterns connected to the second conductive patterns are formed; and
  a second layer arranged under the first layer and having an upper surface on which the laser blocking film is formed.

12. The temperature compensated crystal oscillator according to claim 11, wherein the laser beam blocking film completely covers at least a region of the upper surface of the second layer, said region corresponding to and vertically overlapping the planar thin film resistor.

13. The temperature compensated crystal oscillator according to claim 10, wherein the upper layer has a cavity in which the crystal oscillating unit is positioned.

14. The temperature compensated crystal oscillator according to claim 10, wherein the upper and the lower layers and said at least one middle layer are realized as a single printed circuit layer.

15. The temperature compensated crystal oscillator according to claim 10, wherein the laser beam blocking film is a thin metal film.

16. A temperature compensated crystal oscillator, comprising:
  a layered structure having an upper layer, a lower layer and at least two middle layers between the upper and lower layers;
  a crystal oscillating unit disposed on the upper layer;
  conductive patterns disposed on said two middle layers to form oscillation circuits; and
  a planar thin film resistor arranged on an upper surface of the lower layer of the layered structure for adjusting an output frequency of the temperature compensated crystal oscillator;
  wherein the conductive patterns on the middle layer adjacent to the lower layer are formed completely outside a region corresponding to and vertically overlapping the planar thin film resistor.

* * * * *